United States Patent
Alexander et al.

(10) Patent No.: US 10,120,573 B2
(45) Date of Patent: Nov. 6, 2018

(54) MODULAR SEQUENTIAL WRITING OF DATA TO DATA STORAGE DEVICES

(71) Applicant: Microsoft Technology Licensing, LLC., Redmond, WA (US)

(72) Inventors: Robin Alexander, Woodinville, WA (US); Lee Edward Prewitt, Mercer Island, WA (US); William R. Tipton, Seattle, WA (US); Laura Marie Caulfield, Woodinville, WA (US)

(73) Assignee: MICROSOFT TECHNOLOGY LICENSING, LLC., Redmond, WA (US)

(*) Notice: Subject to any disclaimer, the term of this patent is extended or adjusted under 35 U.S.C. 154(b) by 0 days.

(21) Appl. No.: 15/141,743

(22) Filed: Apr. 28, 2016

(65) Prior Publication Data

US 2017/0075583 A1 Mar. 16, 2017

Related U.S. Application Data

(60) Provisional application No. 62/218,525, filed on Sep. 14, 2015, provisional application No. 62/218,523, filed on Sep. 14, 2015.

(51) Int. Cl.
*G06F 13/00* (2006.01)
*G06F 3/06* (2006.01)
(Continued)

(52) U.S. Cl.
CPC ............ *G06F 3/0605* (2013.01); *G06F 3/061* (2013.01); *G06F 3/064* (2013.01); *G06F 3/0614* (2013.01);
(Continued)

(58) Field of Classification Search
CPC ...... G06F 3/0605; G06F 3/0643; G06F 3/064; G06F 3/0614; G06F 3/0685;
(Continued)

(56) References Cited

U.S. PATENT DOCUMENTS 6,094,693 A 7/2000 Haneda
6,128,224 A 10/2000 Morton et al.
(Continued)

FOREIGN PATENT DOCUMENTS

WO 2007/070763 A2 6/2007
WO 2008023368 A2 2/2008

OTHER PUBLICATIONS

Kim, et al., "FlashSim: A Simulator for NAND Flash-based Solid-State Drives", In Proceedings of First International Conference on Advances in System Simulation, Sep. 20, 2009, pp. 125-131.
(Continued)

*Primary Examiner* — Hong C Kim
(74) *Attorney, Agent, or Firm* — Merchant & Gould P.C.

(57) ABSTRACT

An improved interface for managing disparate read, write, and erase sizes and operations in data storage devices is provided. By improving an interface between a storage system driver layer and associated storage devices, performance of data storage is improved, including improving data storage speed and storage media endurance. Storage media management operations are made more efficient and consistent by providing improved types and sequences of commands sent from the driver layer to the device control layer such that data write operations are performed in a sequential manner as write commands are directed to portions of data as opposed to buffering individual portions of data followed by a large wholescale write/erase process for the buffered data.

18 Claims, 9 Drawing Sheets

(51) Int. Cl.
G11C 16/10 (2006.01)
G11C 16/26 (2006.01)
G11C 16/14 (2006.01)
G06F 12/10 (2016.01)
G11B 20/12 (2006.01)

(52) U.S. Cl.
CPC .......... *G06F 3/0616* (2013.01); *G06F 3/0632* (2013.01); *G06F 3/0638* (2013.01); *G06F 3/0643* (2013.01); *G06F 3/0659* (2013.01); *G06F 3/0673* (2013.01); *G06F 3/0685* (2013.01); *G06F 12/10* (2013.01); *G11B 20/1217* (2013.01); *G11C 16/10* (2013.01); *G11C 16/14* (2013.01); *G11C 16/26* (2013.01); *G06F 2212/1016* (2013.01); *G06F 2212/1036* (2013.01); *G11B 2020/1238* (2013.01); *G11B 2020/1292* (2013.01)

(58) Field of Classification Search
CPC ...... G06F 3/0632; G06F 3/0659; G06F 12/10; G06F 3/0673; G06F 3/0638; G06F 3/0616; G06F 3/061; G06F 2212/1016; G06F 2212/1036; G06F 12/0246; G06F 2212/7202; G06F 3/0679; G06F 2212/7209; G11B 20/1217; G11B 2020/1292; G11B 2020/1238; G11C 16/10; G11C 16/14; G11C 16/26
USPC .............................. 711/202, 170, 154, 5, 103
See application file for complete search history.

(56) References Cited

U.S. PATENT DOCUMENTS

| | | | |
|---|---|---|---|
| 6,279,069 | B1 | 8/2001 | Robinson et al. |
| 6,539,465 | B2 | 3/2003 | Chan et al. |
| 7,694,066 | B2 | 4/2010 | Sakui et al. |
| 8,219,776 | B2 | 7/2012 | Forhan et al. |
| 8,380,944 | B2 | 2/2013 | Dumitru et al. |
| 8,489,855 | B2 | 7/2013 | Schuette |
| 8,504,737 | B2 | 8/2013 | Rysavy |
| 2005/0144367 | A1* | 6/2005 | Sinclair ............... G06F 12/0246 711/103 |
| 2006/0059296 | A1 | 3/2006 | Meir et al. |
| 2007/0136555 | A1* | 6/2007 | Sinclair ............... G06F 3/0605 711/203 |
| 2008/0219053 | A1* | 9/2008 | Kim ................... G11C 16/0483 365/185.11 |
| 2009/0125670 | A1* | 5/2009 | Keays ................. G06F 12/0246 711/103 |
| 2012/0137056 | A1* | 5/2012 | Keays ................. G06F 12/0246 711/103 |

OTHER PUBLICATIONS

Pratibha, et al., "Efficient Flash Translation Layer for Flash Memory", In Proceedings of International Journal of Scientific and Research Publications, vol. 3, Issue 4, Apr. 2013, 6 pages.

Doug Rollins, "The Effect of Host Data Patterns on SSD Write Performance", Retrieved on: Jul. 24, 2015, Available at: https://www.micron.com/~/media/documents/products/technical-marketing-brief/brief_ssd_effect_data_placement_writes.pdf.

Kim, et al., "FTL Design for TRIM Command", In Proceedings of the 5th International Workshop on Software Support for Portable Storage, Oct. 28, 2010, 6 pages.

Ouyang, et al., "SDF: Software-Defined Flash for Web-Search Internet Storage Systems", Presented at ASPOLOS 2014 conference , Salt Lake City, Utah, Mar. 1-5, 2014, 14 pages. Available at: http://www.ece.eng.wayne.edu/~sjiang/pubs/papers/ouyang14-SDF.pdf.

Wang, et al., "An Efficient Design and Implementation of LSM-Tree based Key-Value Store on Open-Channel SSD", Presented at EuroSys 2014 conference, Amsterdam, Netherlands, Apr. 13-16, 2014, 14 pages. Available at: http://vast.cs.ucla.edu/sites/default/files/publications/eurosys2014_final44.pdf.

Kang, et al., "The Multi-streamed Solid-State Drive", Presented at USENIX 2014 conference, May 7, 2014, 5 pages. Available at: https://www.usenix.org/system/files/conference/hotstorage14/hotstorage14-paper-kang.pdf.

"International Search Report and Written Opinion Issued in PCT Application No. PCT/US2016/046097", dated Nov. 7, 2016, 13 Pages.

"International Preliminary Report on Patentability Issued in PCT Application No. PCT/US2016/046097", dated Sep. 27, 2017, 9 Pages.

"Second Written Opinion Issued in PCT Application No. PCT/US2016/046097", dated Jun. 23, 2017, 8 Pages.

* cited by examiner

MODULAR SEQUENTIAL WRITING OF DATA TO DATA STORAGE DEVICES

CROSS REFERENCES TO RELATED APPLICATIONS

This application claims the benefit of U.S. Provisional Patent Application No. 62/218,525, titled "Storage Stack Architecture for Many-log Structured Media" filed Sep. 14, 2015 and claims the benefit of U.S. Provisional Patent Application No. 62/218,523, titled "Exposing and Managing Disparate Read, Write, and Erase Sizes in Data Storage Devices" filed Sep. 14, 2015.

BACKGROUND

Modern computing devices are capable of processing enormous amounts of data via a variety of useful applications that operate as software, firmware and hardware implementations. As data is processed, it is typically written to a temporary memory medium where it may be stored while the associated computing device is powered on or until it is written to a more permanent type of memory where it may be stored indefinitely even after power has been removed from the associated computer or from the memory medium itself. Data that is stored to memory may eventually be output or it may be modified, erased from memory, overwritten, or the like as the data is processed or otherwise manipulated as desired by a user.

Common types of non-volatile memory that maintain data after power-off include hard disk drives that magnetically maintain data on sectors of disks or platters, including higher density disk storage with shingled magnetic recording (SMR) disk drives, as well as, a variety of solid state memory devices (SSD) that store data on interconnected memory chips contained inside the SSDs. In a typical data storage system associated with a variety of computing devices, a host operation or device, for example, a computing operating system or a storage system component such as a device driver operating at the command of the computer operating system, passes data storage instructions to a control unit of the storage medium for directing read, write, and erase operations on the storage medium.

In a typical operation, the host may order data updates at relatively small granularities, for example, a first field for a name, a second field for a street address, a third field for a city, and the like. However, when the storage medium, for example, a hard disk drive or solid state memory device, receives a storage command from the host, the medium in use typically erases a large zone (hard disk drive) or block/page (SSD) and then writes the erased area from beginning to end. Unfortunately, such a process often creates complicated side effects and behaviors which may result in inconsistent and inefficient performance, including storage latency spikes, write amplification leading to device media endurance problems, and interference issues when multiple applications and/or tenants are assigned to a single storage medium. Such problems are exacerbated when storage media software or firmware engages in media management activities such as logical to physical storage media mapping, data encryption, error-correcting code (ECC) operations, bad block mapping, wear-leveling, garbage collection, read and write caching, etc.

It is with respect to these and other considerations that the present disclosure has been made.

SUMMARY

This summary is provided to introduce a selection of concepts in a simplified form that are further described below in the Detailed Description section. This summary is not intended to identify key features or essential features of the claimed subject matter, nor is it intended as an aid in determining the scope of the claimed subject matter.

Aspects of the present disclosure are directed to an improved interface, including improved systems, methods and computer readable media, for managing disparate read, write and erase sizes and operations in data storage devices. By improving an interface between a storage system driver layer and associated storage devices, performance of data storage is improved, including improving data storage speed and data storage media endurance. In addition, storage media management operations are made more efficient and consistent by providing improved types and sequences of commands sent from the driver layer to the device control layer such that data write operations are performed in a sequential manner as write commands are directed to portions of data as opposed to buffering individual portions of data in a temporary buffering medium followed by having a large wholesale write/erase process for the buffered data.

The details of one or more aspects are set forth in the accompanying drawings and description below. Other features and advantages will be apparent from a reading of the following detailed description and a review of the associated drawings. It is to be understood that the following detailed description is explanatory only and is not restrictive of the claims.

BRIEF DESCRIPTION OF THE DRAWINGS

The accompanying drawings, which are incorporated in and constitute a part of this disclosure, illustrate various aspects. In the drawings.

DETAILED DESCRIPTION

Figure 1:
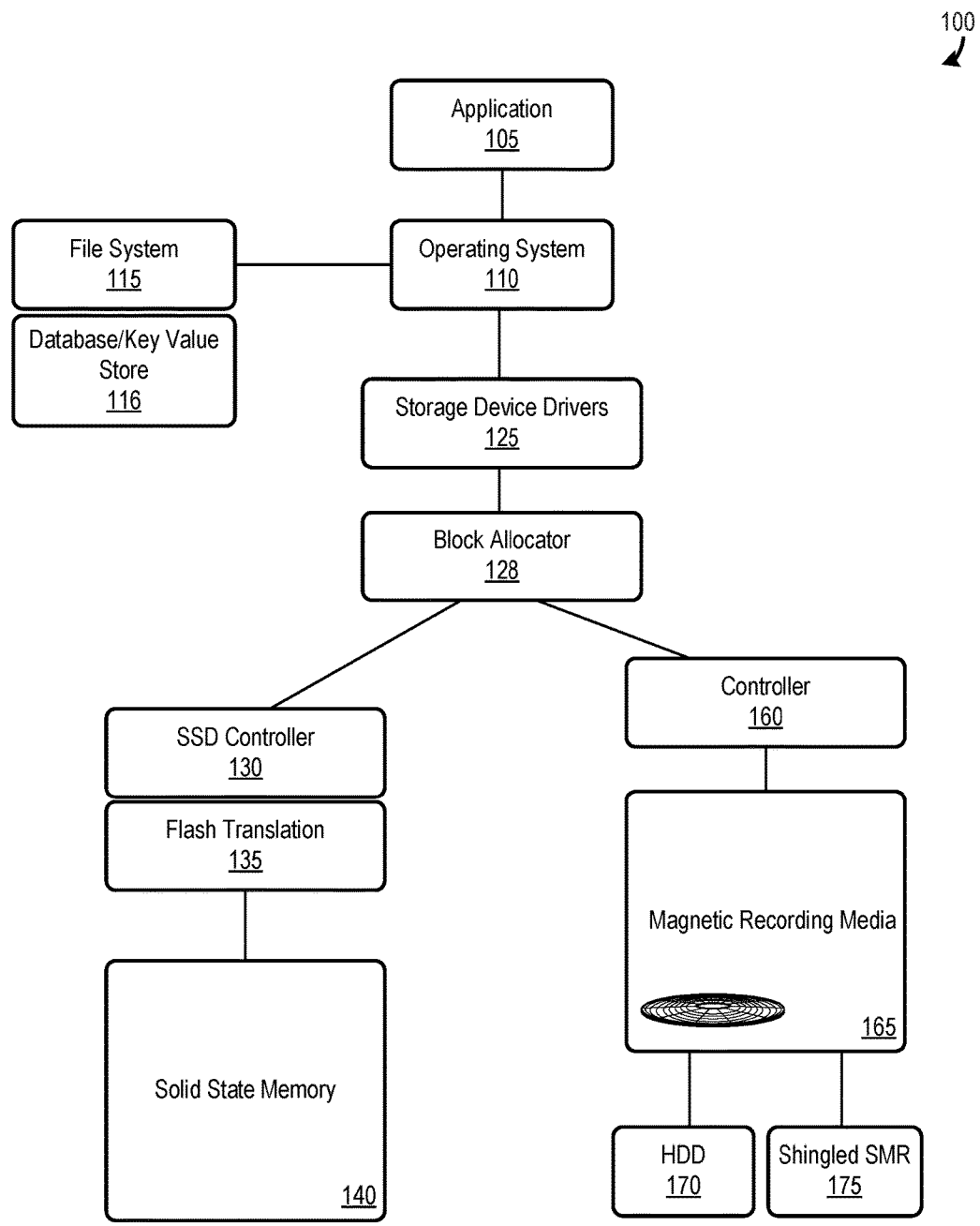
FIG. 1 is a block diagram illustrating components of a data storage system.

The following detailed description refers to the accompanying drawings. Wherever possible, the same reference numbers are used in the drawings and the following description refers to the same or similar elements. While examples may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description is not limiting, but instead, the proper scope is defined by the appended claims. Examples may take the form of a hardware implementation, or an entirely software implementation, or an implementation combining software and hardware aspects. The following detailed description is, therefore, not to be taken in a limiting sense.

As briefly described above, aspects of the present disclosure are directed to an improved interface, including improved systems, methods, and computer readable media, for managing disparate read, write, and erase sizes and operations in data storage devices. According to prior data storage systems, a typical host device or system expects to do data storage updates at small granularities, for example, an update of a name field that is a small granularity portion of an overall name and address data item followed by an operation with which the actual medium, for example, a hard disk drive or SSD storage device has to erase large zones (HDD) or blocks/pages (SSD) followed by a writing of the updated data to those erased areas from beginning to end. Such a process requires an address translation, maintenance of a log (in a database, key-value store, file system, or the like), followed by an address mapping from a logical address for the updated data to a physical address of the updated data on the storage medium. For example, a stored name-address pair may be logically addressed in two neighboring fields, but physically may be stored in the same or two different storage blocks/pages (SSD) or disk platter zones (HDD). Unfortunately, such a process often creates or exposes complicated side effects and behaviors, which results in inconsistent and inefficient performance, particularly when storage device firmware or software also engages in media management activities such as logical to physical storage media mapping, data encryption, error-correcting code (ECC) operations, bad block mapping, wear-leveling, garbage collection which includes the removal of data pieces or objects that are no longer needed, read and write caching, etc.

For example, because the host typically does not know or understand the activities of the storage medium software or firmware, spikes in storage latency may be experienced. For another example, undesired writing (write amplification) to memory may be problematic, particularly for SSD devices that have limited lifetimes. In some cases, write amplification to the storage medium can be on the order of five times (5x) such that every time a host orders a write to a drive, five actual writes may be made to the medium for each one write required. For another example, when multiple tenants are associated with a given storage medium, storage activities for each of the multiple tenants may interfere with each other owing to a difficulty in isolating behavior of any individual tenant from other tenants. Thus, the aggregated effects of storage performance problems associated with each of the multiple tenants create even larger performance problems for the data storage system.

According to aspects of the present disclosure, an improved interface, including improved systems, methods and computer readable media, for managing disparate read, write and erase sizes in data storage devices is provided. According to aspects, an improved device programming interface from a storage system host to one or more storage devices is provided where such storage devices are required to erase large areas of storage media before writing sequentially to smaller segments of the erased areas and to perform low-level hardware computations and management activities such as logical to physical storage media mapping, data encryption, error-correcting code (ECC) operations, bad block mapping, wear-leveling, garbage collection, read and write caching, etc.

According to aspects of the improved interface, the types and sequences of commands sent from a host or device driver layer to a storage medium control unit, firmware or software is provided for improving the performance of read, write, and erase operations of storage devices, improvement of the endurance or available life expectancies of storage associated storage media, for example, hard drive disks or platters or SSD storage chips. Greater manageability of data storage operations is provided through the improved interface between the host device or system and the storage device at which data is stored. Such greater manageability may be provided through a modular approach to sequential writing of data to the data storage device which prevents the host device or system from buffering small writes before writing the small writes to the storage devices. In addition, characterization and qualification efforts associated with new storage media may be maintained at the device driver layer making the interface between the host layer and the storage device layer more efficient and consistent.

According to one example operation, an improved interface to a memory storage device exposes the logical semantics of the device media to the host device or software while maintaining a leaner set of device management operations including logical to physical storage media mapping, data encryption, error-correcting code (ECC) operations, bad block mapping, wear-leveling, garbage collection, read and write caching, etc. According to one example, the host device or system writes sequentially within a given hard drive zone or sector or SSD block or page. The host device or system trims or erases entire blocks or zones in a single erasure operation. The host device or system may read the storage devices randomly, and the host device or system may read and write at the granularity of the medium to which reading and writing are directed according to the granularity that the target medium is capable of, for example, a flash page in a SSD flash storage device. According to another example, according to the improved interface between the host device or system and the storage medium, the host is not required to handle a variety of storage media management operations, as those operations may be pushed down to the interface between a drive layer and associated storage media.

FIG. 1 is a block diagram illustrating components of a data storage stack that is one example of an operating environment for aspects of the present disclosure. The components of the system 100 are illustrative of one or more components that may be associated with or included in a computer-implemented data storage system for reading, writing, and erasing data to one or more data storage media. According to an aspect of the disclosure, the storage system 100 is made up of a number of levels of abstraction, each of which plays a role in improving performance of the overall storage stack's data storage performance and management. According to this aspect, the responsibilities of the components (levels of abstraction) are redefined as described herein for obtaining the improved performance and management. The components of the improved storage stack include a storage system comprised of a file system (or database or key value store), a block allocator, a host lowest level device driver that performs scheduling, storage device firmware, and storage device media.

At the top of the system 100, an application 105 is illustrative of any application, for example, a word processing application, slide presentation application, spreadsheet application, database application, browser application, communications application, notes taking application, calendaring application, and the like with which a user may create, edit, modify, store, save, delete, or otherwise manipulate data of various types and quantities. An operating system 110 is illustrative of a hardware device, firmware system, or software system operative to control input and output to and from a general purpose or mobile computing system, as illustrated and described below with reference to FIGS. 4 and 5A-5B and for serving as a general interface between applications 105 and local and peripheral operations of one or more computing devices.

The file system 115 is illustrative of one or more files accessible by the operating system 110 containing information used for controlling how data is stored, how space is allocated in a granular manner, and is responsible for organizing the storage of data on one or more storage devices, as described below. For example, when a data item is created via an application 105, the file system 115 may be interrogated for information necessary for allocating storage space for the data. For example, if a given data item is comprised of a name, street address, city, state, and zip code, when such a data file is created, the file system 115 may be utilized for allocating space in a solid state memory device or hard drive memory device at which components of the created data at different granularity levels may be stored.

For example, according to one granularity level, each component of the stored name and address data item may serve as one granular level, and thus, storage space may be allocated by the file system for storing the name separately from the street address, separately from the city, separately from the state, and separately from the zip code, or at a larger granularity level, the file system may allocate space for saving the entire name and address data item together as a single stored data item. When a data item is modified and no longer fits or now exceeds the space initially allocated for it by the file system, another allocation may be assigned by the file system 115, and thus, storage of the data item becomes fragmented.

The database/key-value store 116 is illustrative of a database at which information about stored data may be maintained for access by the operating system 110 and/or the file system 115. For example, data corresponding to the logical association of components of various data items may be stored in the database or key-value store 116 and mapping information for mapping logical data addresses to physical data addresses may also be maintained. For example, a name, street address, city, state, zip code may be logically stored in a single file or in related files in a relational database or key-value store 116. On the other hand, each of the components of the data item (or combinations of components of the data item) may be physically stored on a block or page of a solid state memory device or in a given hard disk platter zone, or components (or combinations of components) of the data item may be stored in separate storage blocks/pages or hard disk platter zones, and information mapping the logical addresses of the components of the data item to the physical addresses at which the components or combination of components are actually stored may be maintained in the database or key-value store 116 for accessing by components of the storage system 100, as described herein.

The storage device driver 125 is illustrative of a device, device firmware or software application that operates or controls the solid state memory device 140 or magnetic recording media device 165, described below. The driver 125 may serve as a software or hardware interface to the storage devices for enabling the operating system or other applications to access the functions of the data storage devices without needing to know operating details of the data storage devices. That is, the storage device driver 125 acts as a translator between the operating system 110 and the data storage devices 140, 165. In a typical host/device environment, the device driver layer 125 may serve as a host to the storage devices 140, 165 for interfacing with the storage devices for passing instructions to and receiving output from the storage devices. As should be appreciated, the host layer of the storage system may also include components/systems above the device driver layer such as the file system 115, database/key-value store 116 and the operating system 110.

The block allocator 128 is illustrative of a device, device firmware or software application operative to interface between the host or driver layer 125 and the storage devices 140, 165. According to aspects, the block allocator 128 is responsible for directing the storage of data to particular storage blocks/pages or sectors/zones, for example, storage of sequential data writes to small multiple blocks rather than large contiguous regions of the SSD or HDD. In addition, the block allocator 128 may direct the storage device controllers to perform device management operations, described herein, but also may expose sequential writes of many small logs back up to the file system 115. According to one aspect, the block allocator 128 controls the file system zone allocations into actual allocations on the storage device 140, 165, which is the low level core that monitors how much data each application or each zone, plane, or die is receiving. Based on the statistics that this layer (the block allocator 128) is collecting, wear leveling can also be performed. According to one aspect, the block allocator 128 is responsible, in association with the file system 115, to convert application level isolation allocation properties into actual channel, plane, and die level allocations.

As illustrated in FIG. 1, the block allocator 128 is shown between the device driver 125 and the storage devices 140, 165. Alternatively, the block allocator 128 may be positioned in the storage system stack above the device driver 125. In addition, according to one aspect, the block allocator 128 may be integrated with the file system 115.

Beneath the storage device driver 125 and block allocator 128 are illustrated two types of data storage devices. As should be appreciated, any number of data storage devices may be utilized by a computing system for storing data, including solid state storage devices, magnetic recording media devices, optical recording devices, magnetic tape recording devices, and the like. For purposes of illustration, two types of storage devices are illustrated and described with reference to FIG. 1, including a solid state recording device and a magnetic recording media device, but as should be appreciated, aspects of the present disclosure may be equally applied to any of a number of types of storage devices where the interface between the device driver layer 125 and the storage media is improved, as described herein.

Referring still to FIG. 1, a solid state memory device 140 is illustrative of a non-volatile memory medium onto which data may be persistently stored on one or more integrated circuit chips, boards, or assemblies contained in the solid state memory device. Typical solid state memory devices (SSD) may be operated as NAND-based devices or may be operated as NOR-based devices, or may utilize a variety of other solid state technologies such as phase change memory (PCM), spin torque transfer (STT), and the like, as is well known to those skilled in the art. SSD devices, sometimes also referred to as flash devices, may be operated internally in a computing device, for example, a laptop computer, handheld computing device, mobile telephone, mobile media player, and the like. In addition, SSD memory devices may be operated externally to such a device and may be plugged into or otherwise attached to a computing device, such as the attachment of a universal serial bus (USB) type flash drive for storing data as described herein. SSD storage devices are well known to those skilled in the art.

The SSD controller 130 is illustrative of a controller device, device firmware or software application associated with or incorporated into the solid state memory device for receiving instructions from the storage device driver 125 for reading, writing, and erasing data to/from the SSD and for controlling operations of the memory device including various memory device management functions. As is well known to those skilled in the art, such memory functions may include error-correcting code functions (ECC) for managing the correction or recovery of data when errors are introduced to data transmitted to or stored on the solid state memory device. Another function performed by the SSD controller 130 includes wear-leveling, which includes the management of data storage and data erasure applied to the various blocks or pages available on the solid state device for maximizing the available lifetime of the device by evenly distributing data writing and erasure among available storage blocks or pages.

Other management functions performed by the SSD controller 130 include bad block or bad sector management, whereby blocks or pages on which data may be stored that are found to be defective or otherwise inaccessible are mapped and designated by the controller 130 so that such bad blocks or sectors may be bypassed in future read/write/erasure operations. Additional functions that may be performed by the SSD controller 130 include garbage collection and data encryption. As is well known to those skilled in the art, garbage collection includes any number of operations directed by the controller 130 for identifying and removing pieces of data from memory that are no longer in use by a given application 105 or operating system 110 so that memory occupied by such pieces of data may be reclaimed for use in other data read/write operations. As is well known to those skilled in the art, data encryption includes any operation performed on data for formatting or structuring the data such that it may only be accessed, read, modified, or erased by authorized persons. As should be appreciated, the foregoing functions that may be performed by the SSD controller 130 are not exhaustive of all functions that may be performed by the SSD controller 130 with respect to the SSD memory device 140, but are illustrative of the types of functions that may be performed by the SSD controller 130 as illustrated herein.

As briefly described above, one function required for storing data to a memory device such as the SSD memory device 140 includes mapping data from a logical memory address (also referred to as a logical block address or LBA with respect to SSD memory devices) received from the host layer above the storage device driver 125 to a physical block address (PBA) on the actual solid state memory device. According to one aspect of the present disclosure, the flash transition layer 135 may be operative to act at the direction of the SSD controller 130 for mapping logical block addresses to physical block addresses, as described herein. While the SSD controller 130 and flash transition layer 135 are illustrated separately from the solid state memory device 140, as should be appreciated by those skilled in the art, these components may be operated separately from the physical memory device 140, or may be integrated inside the solid state memory device 140, as illustrated and described below with reference to FIG. 2A.

Referring to the right side of FIG. 1, a magnetic recording media device 165 is illustrative of a typical hard disk drive storage device with which data may be stored on track sector (zones) of a hard disk or platter contained in the magnetic recording media device 165. A controller 160 is illustrative of a controller for directing data storage read, write, and erasure operations, as well as data management operations such as logical to physical storage media mapping, data encryption, error-correcting code (ECC) operations, bad block mapping, wear-leveling, garbage collection, read and write caching, etc., as described above with reference to the solid state memory device 140. The controller 160 is illustrated separate from the magnetic recording media device 165, but as appreciated by those skilled in the art, the controller 160 may be operated as a separate component for controlling the operations of the magnetic recording media device 165 or it may be integrated with the magnetic recording media device 165 as is common with typical hard disk drive or shingled magnetic recording drive systems. As described below with reference to FIG. 2B, magnetic recording media may be implemented according to a variety of different device implementations, for example, basic hard disk drives 170 or shingled magnetic recording devices 175. Magnetic recording media storage devices 165 are well known to those skilled in the art.

According to aspects of the present disclosure, the components of the storage system 100, illustrated and described with reference to FIG. 1, may be implemented according to a variety of physical implementations. For example, all the components of the storage system 100 may be housed internally in a given computing device. For another example, the host layer components and all components above the host layer (including operating systems, file systems, applications, etc.) may be housed in or loaded onto a computing device and the storage devices 140, 165 may be operated externally of the computing device. In a distributed computing environment (sometimes referred to as a cloud computing environment), the data storage devices may be operated at one or more datacenters that are operated and maintained remotely from the other components of the storage system 100.

Figure 2A:
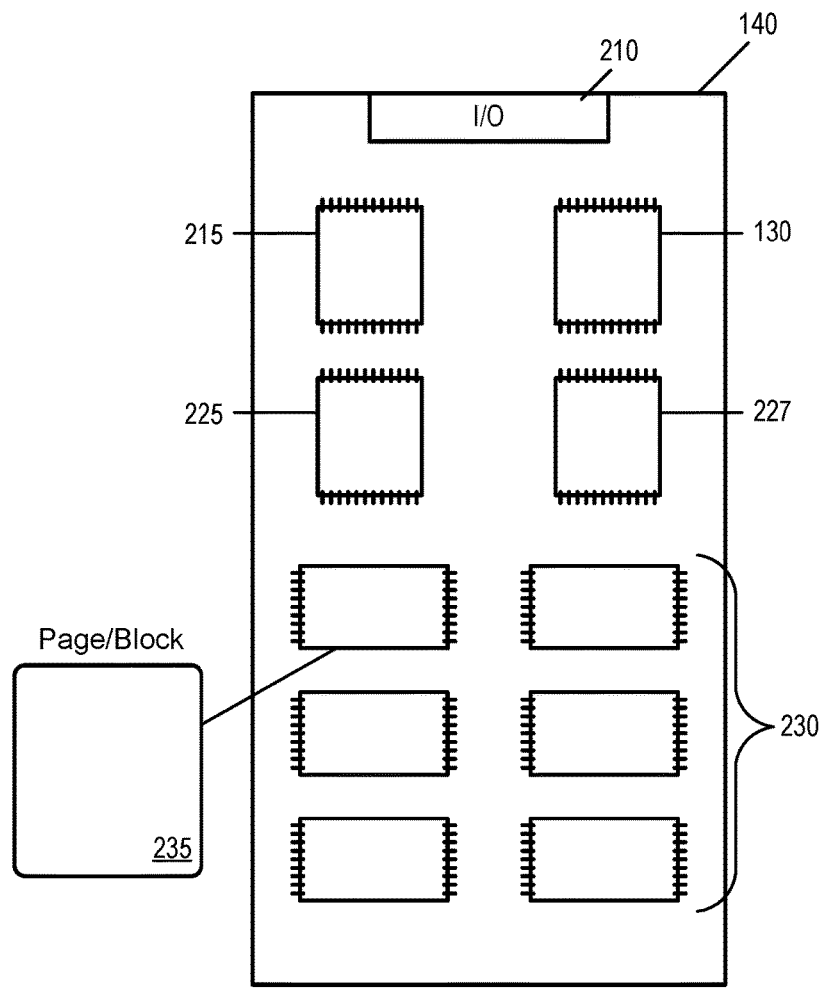
FIG. 2A is a block diagram of a solid state storage device or system.

Referring now to FIG. 2A, an internal view of a typical solid state memory device 140 is provided illustrating various components of the solid state memory device 140. An input output device or module 210 is illustrative of an input output interface with which the SSD device 140 is operatively connected to a storage device driver layer 125 for data input and output to and from the SSD 140. The SSD controller 130 is illustrated as an integrated circuit chip or card mounted inside the SSD device 140 for controlling the operations of the device 140, as described above. A cache chip or card 215 is illustrative of a solid state chip or card contained in the solid state memory device 140 for temporarily storing instructions to and from the SSD controller 130 and for temporarily storing data input to the SSD device 140 or output from the SSD device 140 in association with read/write operations to persistent storage cards 230, described below.

A wear-leveling chip or card 227 is illustrative of a control component or storage component on which information and control logic may be maintained and operated by the control chip or card 130 for performing wear-leveling operations with respect to the data pages/blocks 235 contained in the one or more storage cards/chips 230. The channel scheduler card/chip 225 is illustrative of a device, device firmware or software application operative to schedule data writes to various SSD storage/Flash chips 230 and for handling data parallelism in the SSD device 140. As known to those skilled in the art, channels refer to the number of storage chips 230 the SSD controller 130 can communicate with simultaneously where different levels of SSDs have different numbers of channels (e.g., low level SSDs—2 or 4 channels; high level SSDs—8 or 10 channels). The channel scheduler 225 may assist the host layer or storage device in scheduling and/or controlling data writes through the channels of the SSD, including parallel data writes.

The flash storage card/chips 230 are illustrative of a plurality of solid state chips or cards stored inside the solid state memory device 140 onto which data is stored, read, written to, and erased at the direction of the SSD controller 130. The page/block 235 is illustrative of an individual storage zone contained on one of the flash cards 230 at which data may be stored, read from, or erased, as described herein.

Figure 2B:
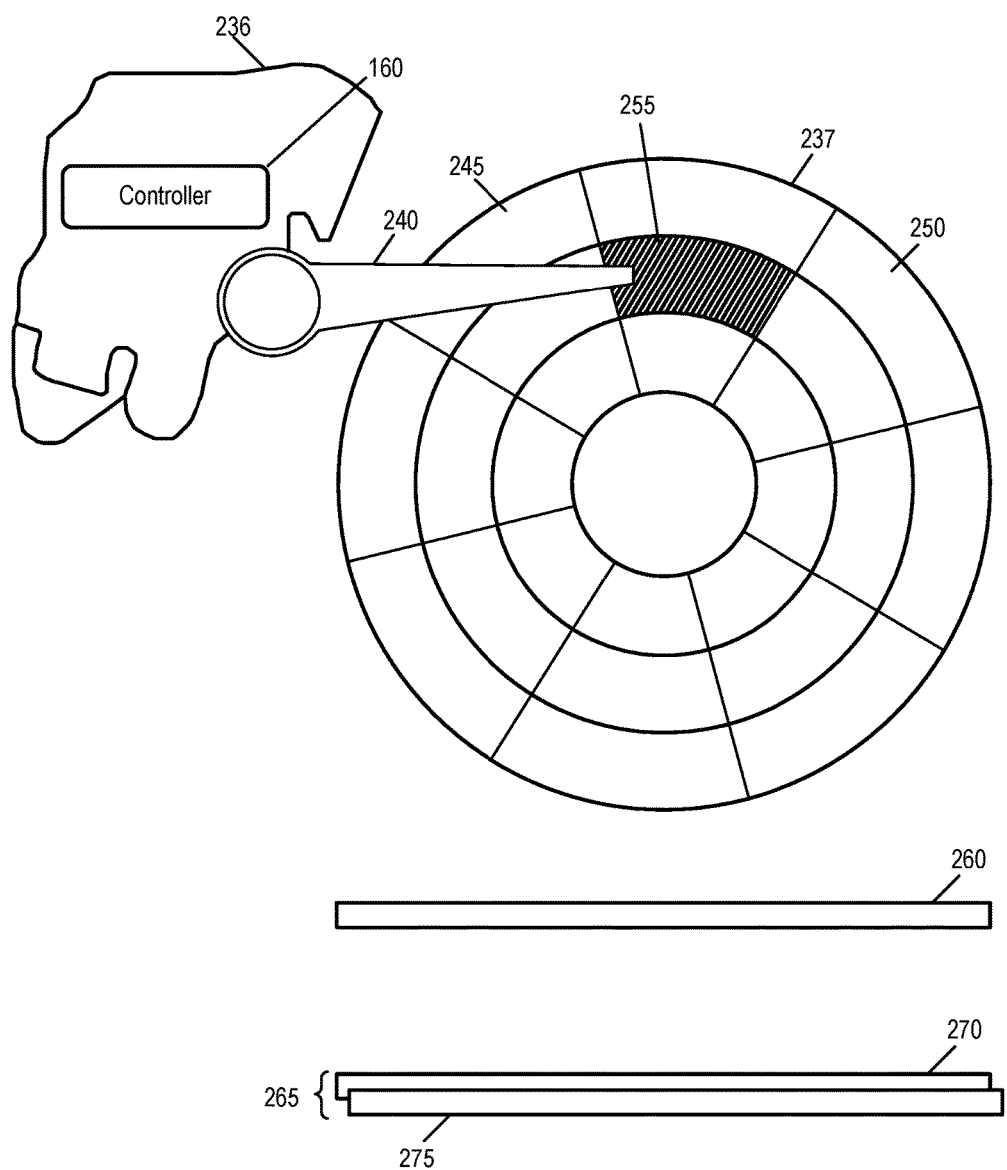
FIG. 2B is a block diagram of components of a typical hard disk storage device.

Referring now to FIG. 2B, components of a typical hard disk drive 165 are illustrated and described. Portions of a control unit 236 are illustrated in which is maintained the controller 160 for performing control operations designated for the storage device level as part of the improved interface between the host layer and the storage device layer, as described herein and in similar manner as described above for the SSD 140. A hard disk or platter 237 is illustrated that is divided into a number of tracks and sectors 250 that are further divided into sector zones 245, 255 onto which data may be stored through a control actuator arm and read/write head 240 operatively connected to the disk or platter 237 from the control unit 236. Operation of components of a hard disk drive storage device 165 is well known to those skilled in the art.

Referring still to FIG. 2B, beneath the example hard disk platter 237 a bar 260 is illustrated for describing traditional non-overlapping storage on a hard disk platter 237 where data is stored in tracks parallel to each other in a non-overlapping fashion. The overlapping bars 265 illustrate shingled magnetic recording storage with which tracks of data may be written in overlapping fashion where a first track 270 may partially overlap a second track 275 for increasing storage density on the associated platter 237. Shingled magnetic recording (SMR) devices and methods are well known to those skilled in the art.

As described herein, according to aspects of the present disclosure, an improved interface between the storage system host layer and storage system device media includes changes to the types and sequences of commands being sent from the host layer (e.g., device driver layer) to the storage devices 140, 165 via the SSD controller 130 and flash transition layer 135 (for SSDs) and the controller 160 for HDDs. In terms of the types of commands and operations distributed between the host layer and the storage device layer, according to one aspect of the present disclosure, greater manageability of data storage operations is improved by providing more storage operation control to the storage system host layer via an improved interface between the host layer, including the device driver layer, and the storage media layer (140, 165). For example, data storage management operations such as logical to physical address translation and garbage collection are controlled at the host layer (e.g., at the device driver 125 or file system 115) which will give the host layer control over when such operations occur. That is, by having the host layer control the scheduling and performance of such operations, such problems as storage latency may be improved because the host layer can de-conflict the performance of such operations with other required operations to reduce overburdening the storage device with operations at times when the storage device is already tasked with one or more other operations.

According to another aspect, by improving the interface between the host layer and the storage devices, not only is a more modular approach to data storage provided with respect to placing more of the management activities at the host layer as described above, but in addition, instead of buffering small data writes from arbitrary workloads, large characterization and qualification efforts associated with new storage media may be maintained at the device driver layer, and data writes may be directed to the storage devices (media) by the host layer in a sequential manner rather than buffering followed by large wholesale write operations.

Continuing with a discussion of the types of commands between the host (driver device layer) and the storage devices, operations of various storage device management functions may be divided among storage system components for causing data storage to be more efficient and consistent. For example, according to aspects, wear-leveling operations may be maintained at the storage device level, because while SDD devices require wear-leveling operations, hard disk drive (or SMR) storage systems do not. Thus, wear-leveling operations are maintained at the storage device level rather than moving those operations to the host level, which may not need to perform wear-leveling operations depending on the storage device type.

According to prior systems, much if not all of the data storage management operations is/are maintained and directed from the host layer regardless of the type of data storage device being utilized. According to aspects of the present disclosure, those data storage and management functions that are applicable to all data storage types may be maintained and operated from the host layer where those data storage or management functions that are particular to a given type of storage device (e.g., SDD) are maintained and operated at the device level. For example, power off/power on data retention management functions would be maintained and operated at the storage device. Similarly, error correction code (ECC) operations would be maintained and operated at the storage device. Thus, by maintaining data storage management operations at the host layer that are applicable to all types of data storage devices, the host layer data storage management instructions do not have to be modified and rewritten each time a different type of data storage device is added to the storage system 100. Because data storage management instructions specifically applicable to each type of data storage device will be maintained and operated at the data storage device, the host layer does not have to be burdened with device management operations that are only applicable to some but not all devices to which data may be stored.

Improving the sequence of commands between the host layer and the storage device layer improves storage performance and device endurance. In terms of performance as a function of the sequence of commands between the host layer and the storage device layer, consider, for example, that for a single user writing data to storage sequentially, the write operation is very fast for the storage device. However, for multiple users, for example, four users, each writing data to storage sequentially, then the data write operations begin to be made to the drive randomly and slowly. According to aspects of the present disclosure, the data writes for each of the multiple users are separated such that the data write operations may be speeded up for each of the individuals comprising the multiple users.

According to another aspect of the present disclosure, by improving the interface between the storage system drive layer (host) and the storage system media layer (140, 165), the endurance of storage media is improved. Continuing with the above example of four different users writing data to the same storage device, by keeping the data write operations separate for each of the users, write amplification is eliminated, for example, where the write amplification drops from 4-5 data writes to one (1).

As described above, data writes to SDD blocks/pages or hard drive zones are performed sequentially as opposed to large wholesale writes after data writes are temporarily buffered. According to prior systems, instead of writing data sequentially within a block or track sector (zone) entire blocks or zones are erased following by a write of the erased blocks or zones. That is, instead of writing a 4 k or 512 byte block or zone, prior systems would require the writing of an entire four megabyte block or zone at once where they would do a complete erase and rewrite in one operation, which makes the erase and rewrite process relatively inflexible and inefficient. According to aspects of the present disclosure, rather than buffering a large amount of data followed by a wholesale erase and rewrite of a large (e.g., four megabytes) storage block or zone, the data is written sequentially piece by piece as the writes are directed in association with the granularity architecture of the target storage device.

For example, data portion 2 would not be written followed by data portion 4 followed by data portion 8 and then followed by data portion 1. According to these aspects of the disclosure, the host layer would erase a whole block/page or hard drive zone at once followed by a sequential data write of data portion 1 followed by data portion 2 followed by data portion 3, and so on to the erased block or zone. Data may be read randomly from various blocks/pages or zones of the storage devices, but according to aspects of the present disclosure, the data would be written sequentially, as described.

Next, the granularity of data read and written by the host layer is paired to the architecture of the target media so that sequential data writes are paired to available storage blocks/pages or zones. For example, for a name/address data item, as described above, comprised of a name, street address, city, state, and zip code, the granularity of the data written to the storage device will match the architecture of the storage device. For example, for a given SDD, if the granularity of the SDD is such that a block or page will hold each of a name, street address, city, state or zip code, but not all of these components, then each component (name, street address, city, state, zip code) will be written sequentially to blocks/pages in the example SSD for each component. On the other hand, if the granularity architecture of the target media is such that the name, street address and city may be written to a single block/page or track sector (zone), then a data write of the name, street address and city may be written to an individual block/page or track sector followed by a next sequential data write of the next granular data portion matching the granularity architecture of the target media.

Figure 3A:
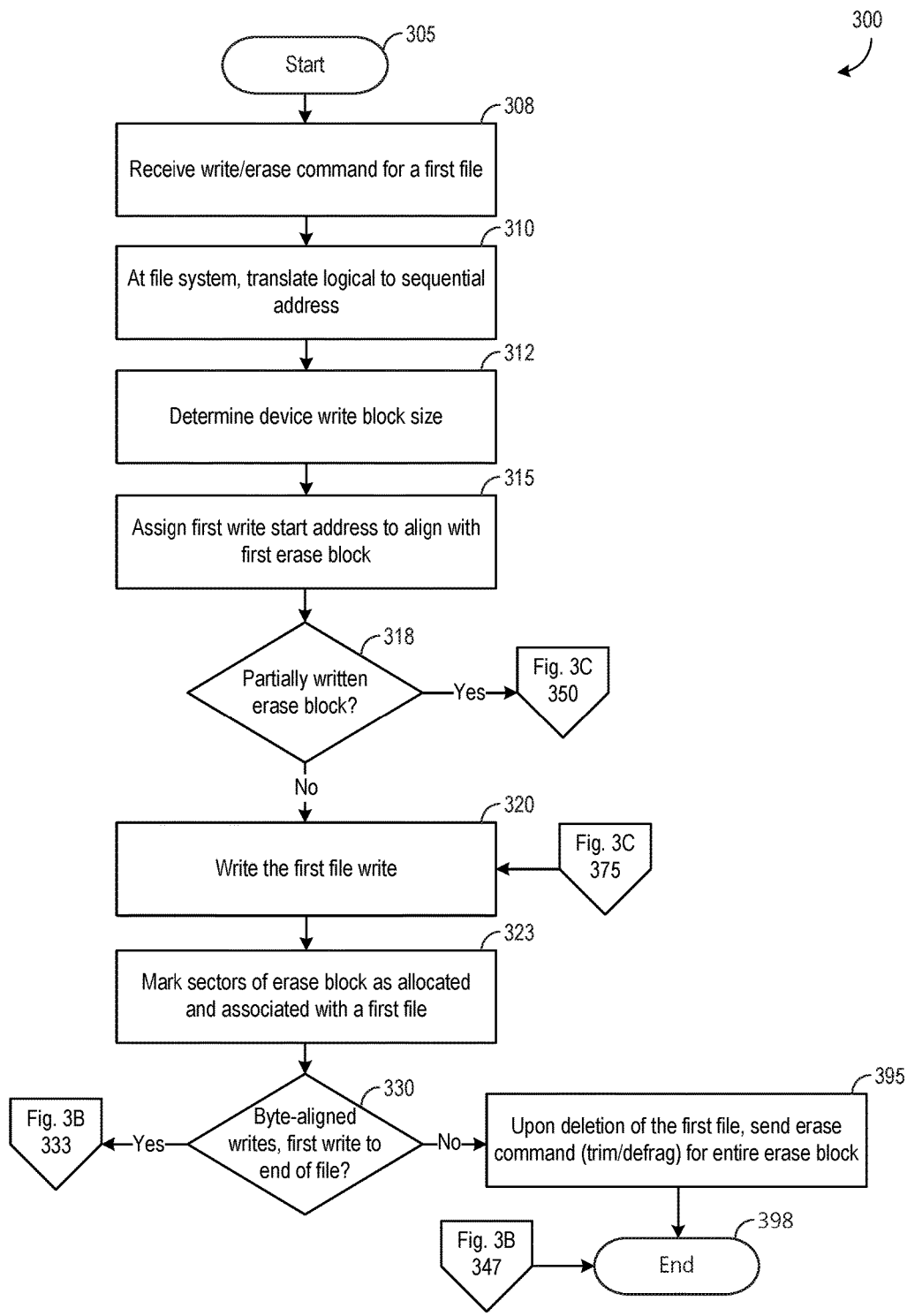
FIGS. 3A-3C are flow charts showing general stages involved in an example method for improving the management of read, write and erase operations in data storage devices.
Figure 3B:
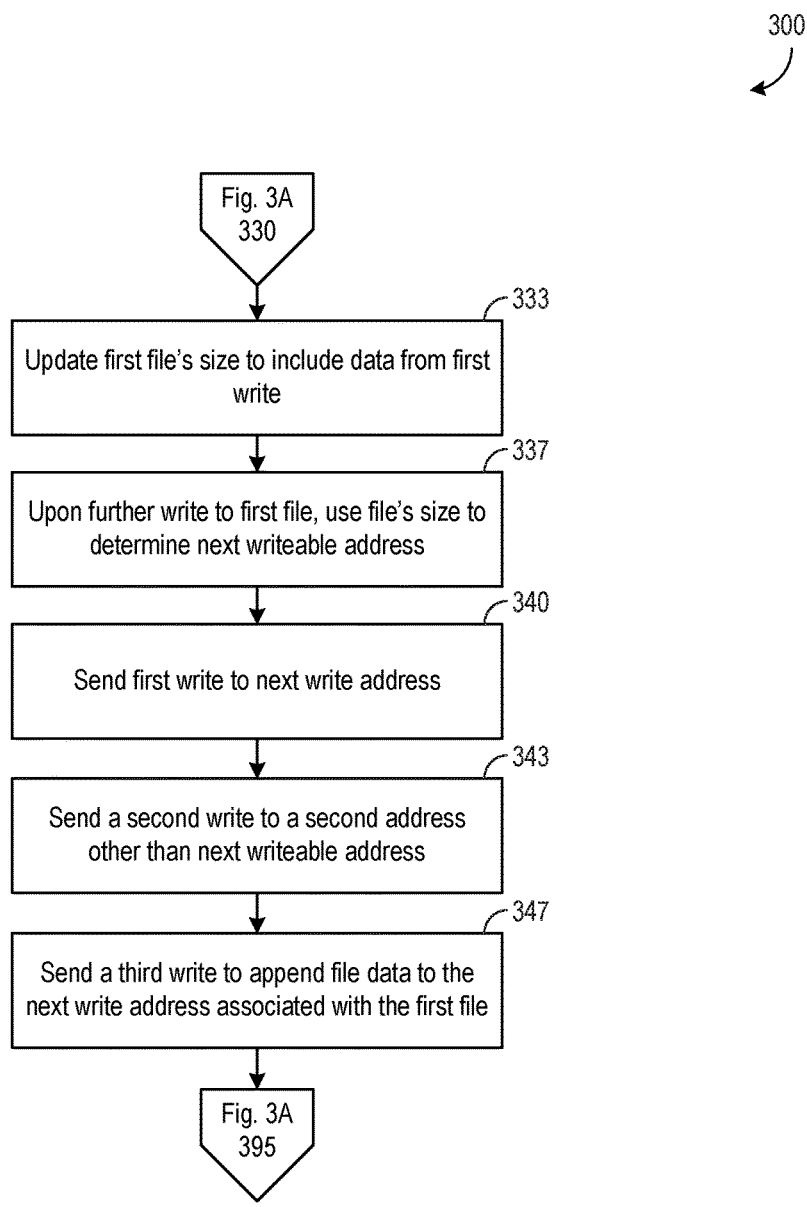
Figure 3C:
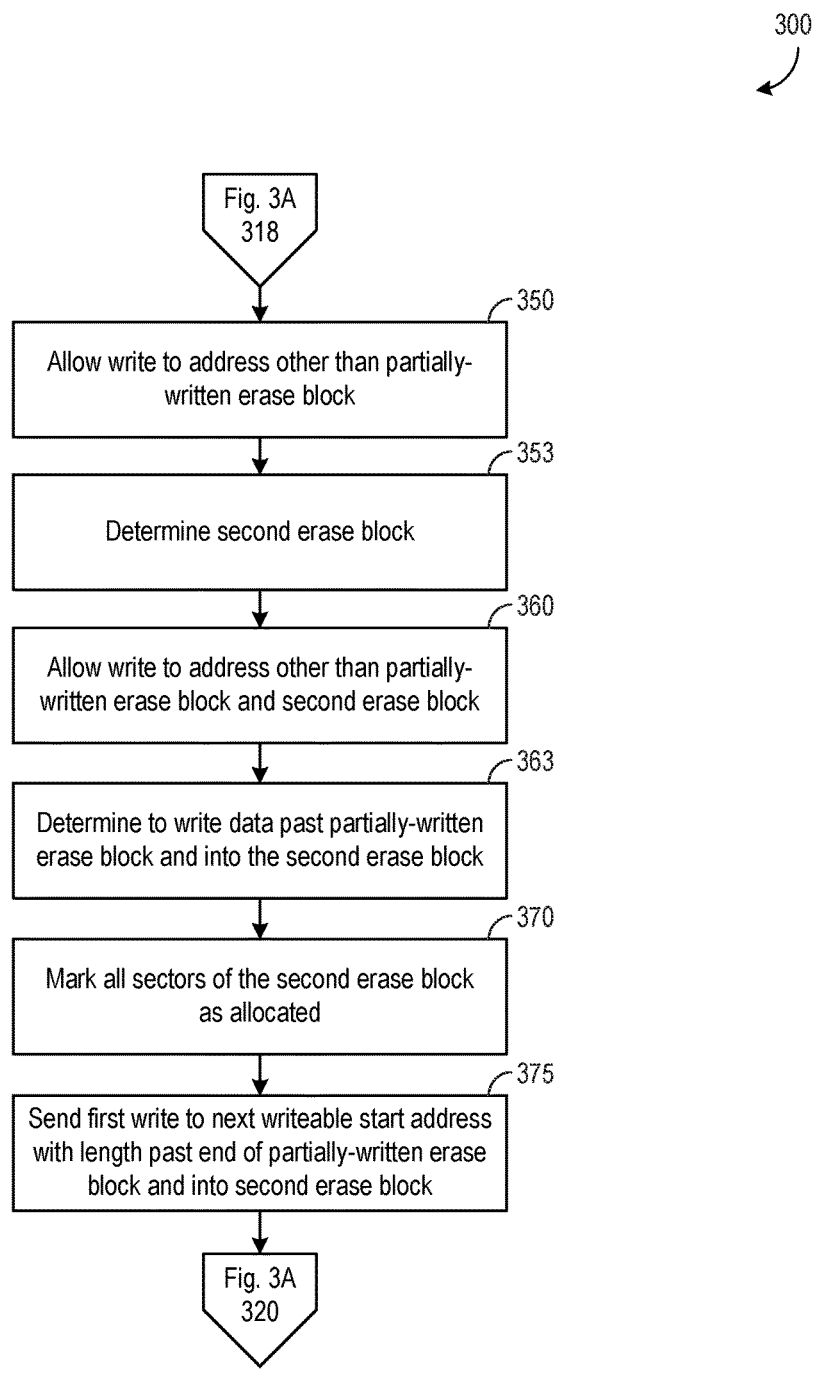

Having described an example storage system architecture and various aspects of the present disclosure above with reference to FIGS. 1, 2A and 2B, FIGS. 3A-3C are flow charts showing general stages involved in an example method for improving the management of read, write, and erase operations in data storage devices. For purposes of description of FIGS. 3A-3C, consider the following example operation associated with the saving of a single file comprised of multiple writes to storage when allocating an entire erase block for the file. Such an example operation may be performed for saving or storage of a data file to a target storage device 140, 165 in response to an example data save operation executed at an application 105. For further example, the steps illustrated in FIGS. 3A-3C describe one example write granularity associated with a file write to storage, but the steps illustrated in FIGS. 3A-3C are not meant to be exclusive of other write granularities that may be accomplished according to aspects of the present disclosure.

The routine 300 begins at start operation 305 and proceeds to operation 308 where a write/erase command for a first file is received as a result of an example save operation performed at an application 105. At operation 310, at the file system 115, a translation of logical to sequential address for the write/erase command is processed. According to an aspect, the sequentialized address does not have to be a physical address. There can be a mapping in the storage device 140, 165 (e.g., flash-block granularity), and still gain the desired efficiencies described herein. This simple mapping allows for wear-leveling in the storage device. For example, as described above, if the write/erase command is associated with the writing of a name/address data entry containing a name, street address, city, state, zip code, at the file system 115, a translation or mapping of the logical addresses for the data as maintained in a database or other storage system to one or more physical addresses at which the data will be sequentially stored on a target SSD or HDD device 140, 165 is performed.

At operation 312, a determination of the device write area (block, page, sector, zone) size is performed where a determination is made as to whether the device write area size is smaller than the device's erase area size and whether the device write area size is distinct from the device's read size. That is, determining that the erase area size and the read size are distinct allows for avoiding a situation where the drive's erase area size is exactly the same size as the device's exposed LBA size or sector size. According to one aspect, in the case of SSD flash type drives, the erase area size is not the same as the LBA size or sector size. According to one aspect, in the case of shingled magnetic media, the erase area size may differ depending on the zone in which the write will occur.

At operation 315, a first write start address is assigned to align with a first erase area where the data to be written is not an integer multiple of the erase area size. That is, according to aspects of the present disclosure, the data to be written will only partially write to at least one erase area. For example, for a write smaller than the erase size, the data to be written is not being written to an entire erase area at once.

At operation 318, a determination is made as to whether the erase area is partially written, including a next writable start address in the partially-written erase area. If the erase area is not partially written, the method 300 proceeds to operation 320 where the first file write (first portion of the file to be written to storage) to be written sequentially is directed for writing by the host layer (for example, the device driver layer 125). At operation 323 all sectors of the erase area are marked as allocated and associated with the first file in the file system 115 metadata. That is, by marking sectors of the erase area as allocated and associated with the first file, the system may avoid an undesirable situation where the same erase area is associated with multiple files to be written.

At decision operation 330, a determination is made as to whether byte-aligned writes are allowed and whether the first file write was to the end of a file. If not, the routine proceeds to operation 395 where upon deletion of the first file, a TRIM (for SSDs) command or an erase (defrag for HDDs) command for the entire erase area is directed to the storage device even though only a portion of the erase area was written and used because the erase area was allocated to that deleted first file. After operation 395, routine 300 may conclude at end operation 398.

Referring back to decision operation 330, if the target storage device 140, 165 allows byte-aligned writes and the first file write was to the end of a file, the routine 300 proceeds to operation 333, FIG. 3B. At operation 333, in addition to marking all sectors of the erase area as allocated and associated with the first file in the file system metadata, as described above, the first file's size is updated to include the data from the first file write. Thus, if the whole erase area is marked as allocated to that file and if data will be appended to the end of that file, then that file size, as appended, may be used to determine the next writable address within the erase area without allocating the erase area as in operation 337.

For example, if a file to be written is 512 bytes in size, and an entire four megabyte erase area has been allocated for that file write, and if the size is being doubled to 1 k, the driver can take the erase area size of 4 megabytes as a modulo, and the offset to write into that erase area is 512 bytes as the next writable address within the erase area. According to an aspect, this applies to an appendance model and not for a overwriting of the data in the vector. This aspect applies to allocating the entire erase area for the file. That is, when file size is increased according to the present example, extra writeable space is being located for the appended file size.

At operation 340, the first write is sent to the next writable address, and at operation 343, a second write, if ordered, is sent to a second address other than the next writable address. At operation 347, after sending a second write, a third write may be sent to append file data to the next writable address associated with the file to be written. The foregoing process may iterate until all writes for the first file are written to storage. After operation 347, the routine 300 proceeds back to operation 395 FIG. 3A.

Referring back to decision operation 318, FIG. 3A, if determination is made that an erase area is partially-written, the routine 300 proceeds to operation 350, FIG. 3C. At operation 350, a write from the first file is allowed to be written to an address other than the partially-written erase area. That is, by optionally allowing a write to an address other than the partially-written erase area (i.e., some other erase area), the system 100 is not constrained to only have one erase area written at a time.

At operation 353, a determination is made of a second erase area, logically contiguous to and following the partially-written erase area that is empty and writable from the start. At operation 360, a next write is allowed to an address other than the partially-written erase area and the second erase area. At operation 363, a determination is made to write data of a length extending past the end of the partially-written erase area into the second erase area. At operation 370, all sectors of the second empty erase area are marked as allocated on the same storage medium, or logical volume, or file system. At operation 375, after marking all sectors as allocated, the next write of the current file being written is sent to the next writable start address with a length of data extending past the end of the partially-written erase area into the second erase area. After operation 375, the routine 300 proceeds back to operation 320 FIG. 3A.

Allowing a write to an address other than the partially-written erase area and the second erase area provides the ability for the system to write where the data is overlapping from a partially-written erase area directly into the next contiguous erase area. For example, where there are only 512 bytes remaining in an erase area, as long as the next erase area is known to be empty, the system can write into that next area. According to one aspect, when an erase area is partially written, any of the written blocks or sectors may be read from. In addition, ECC may be performed on a per block or per sector basis.

While implementations have been described in the general context of program modules that execute in conjunction with an application program that runs on an operating system on a computer, those skilled in the art will recognize that aspects may also be implemented in combination with other program modules. Generally, program modules include routines, programs, components, data structures, and other types of structures that perform particular tasks or implement particular abstract data types.

The aspects and functionalities described herein may operate via a multitude of computing systems including, without limitation, desktop computer systems, wired and wireless computing systems, mobile computing systems (e.g., mobile telephones, netbooks, tablet or slate type computers, notebook computers, and laptop computers), hand-held devices, multiprocessor systems, microprocessor-based or programmable consumer electronics, minicomputers, and mainframe computers.

In addition, according to an aspect, the aspects and functionalities described herein operate over distributed systems (e.g., cloud-based computing systems), where application functionality, memory, data storage and retrieval and various processing functions are operated remotely from each other over a distributed computing network, such as the Internet or an intranet. According to an aspect, user interfaces and information of various types are displayed via on-board computing device displays or via remote display units associated with one or more computing devices. For example, user interfaces and information of various types are displayed and interacted with on a wall surface onto which user interfaces and information of various types are projected. Interaction with the multitude of computing systems with which implementations are practiced include, keystroke entry, touch screen entry, voice or other audio entry, gesture entry where an associated computing device is equipped with detection (e.g., camera) functionality for capturing and interpreting user gestures for controlling the functionality of the computing device, and the like.

Figure 4:
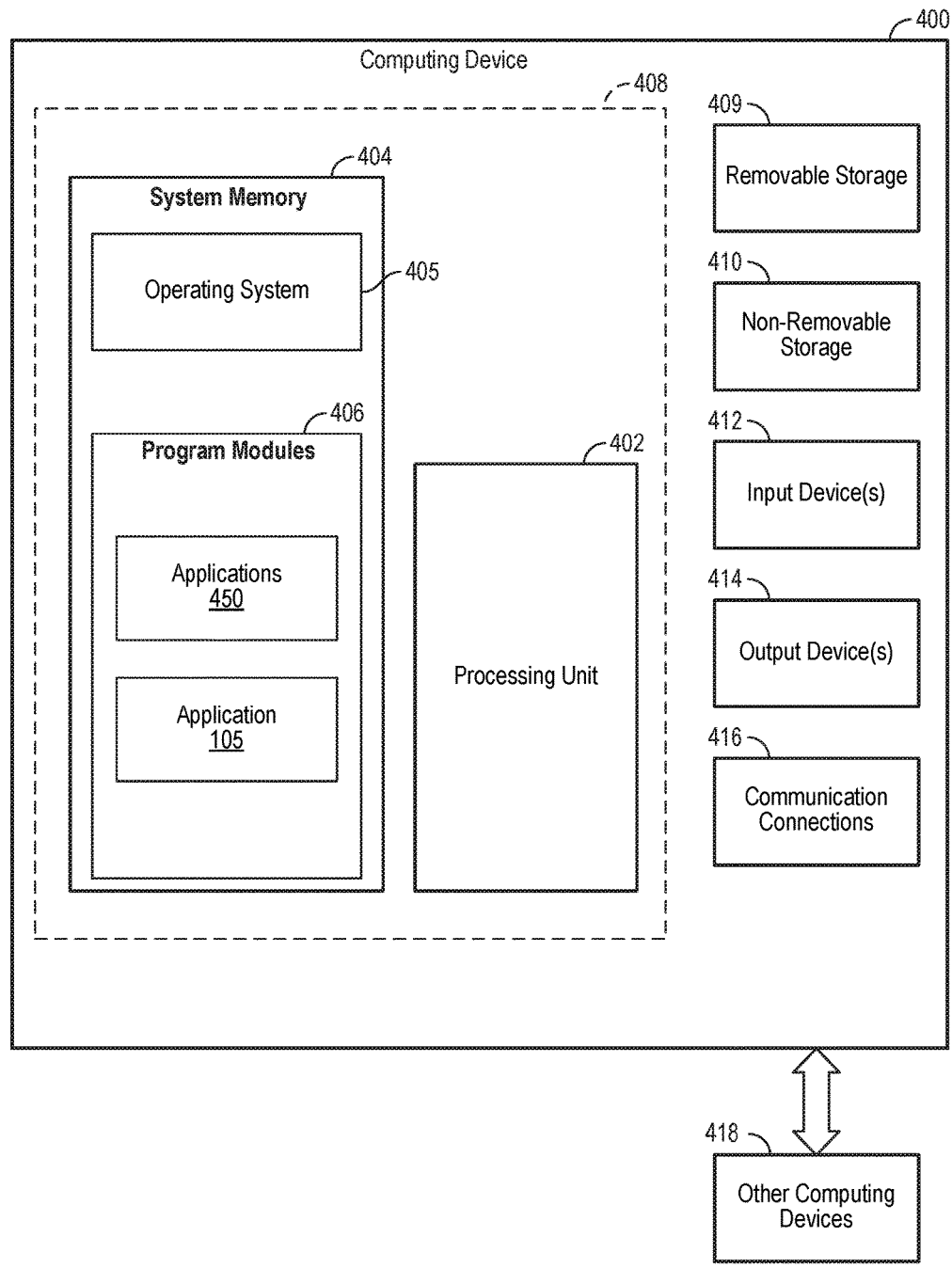
FIG. 4 is a block diagram illustrating example physical components of a computing device.
Figure 5A:
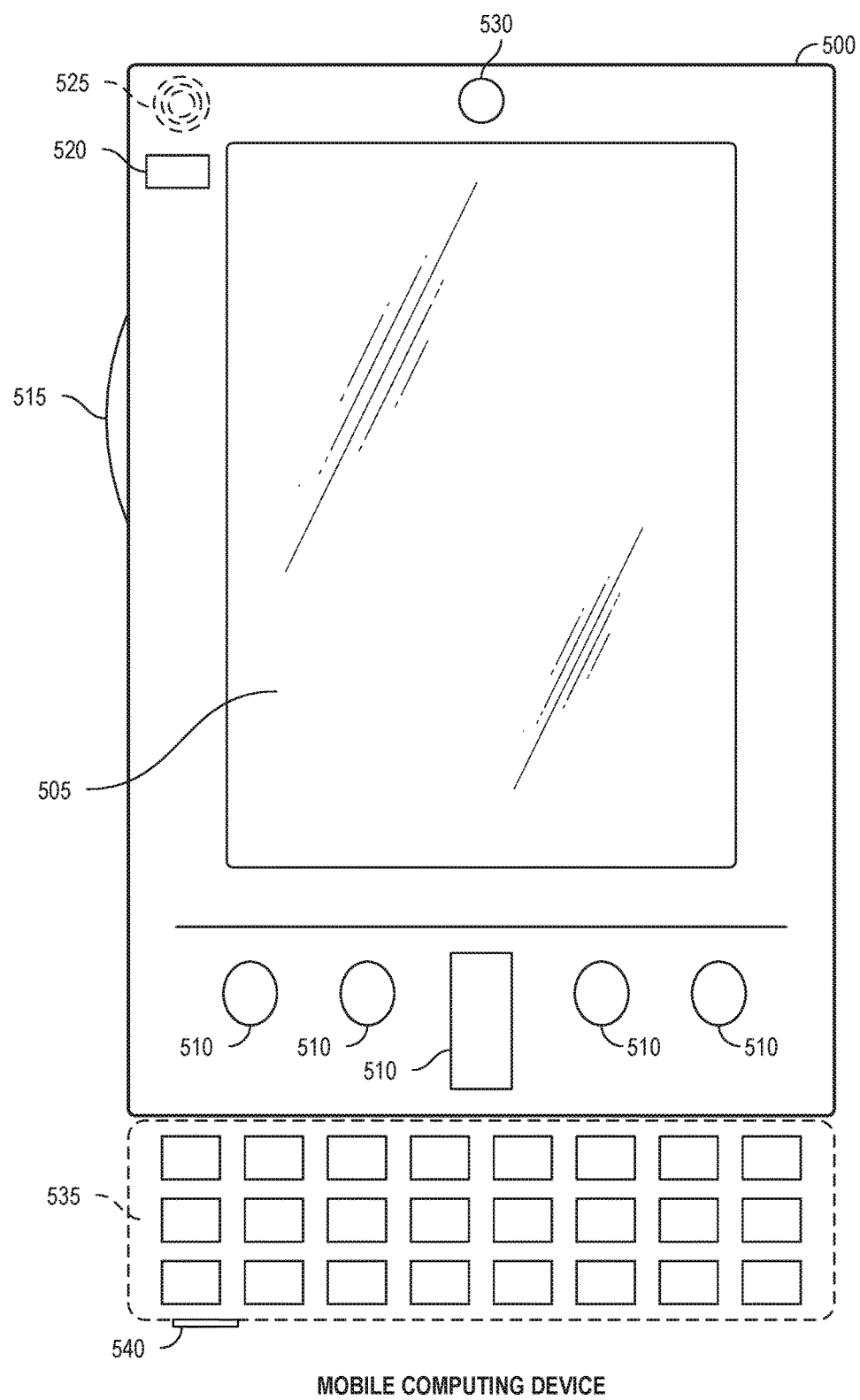
FIGS. 5A and 5B are block diagrams illustrating example physical components of a mobile computing device.
Figure 5B:
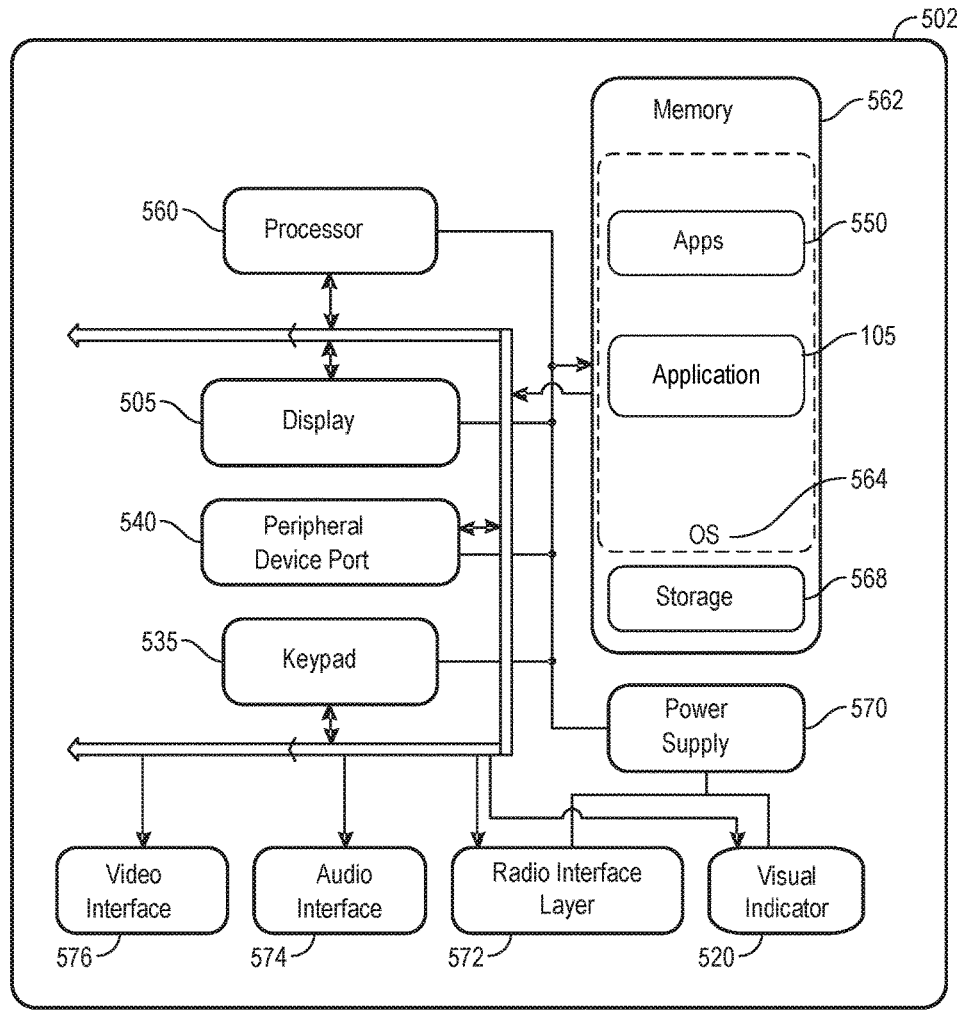

FIGS. 4, 5A and 5B and the associated descriptions provide a discussion of a variety of operating environments in which examples are practiced. However, the devices and systems illustrated and discussed with respect to FIGS. 4, 5A and 5B are for purposes of example and illustration and are not limiting of a vast number of computing device configurations that are utilized for practicing aspects, described herein.

FIG. 4 is a block diagram illustrating physical components (i.e., hardware) of a computing device 400 with which examples of the present disclosure are be practiced. In a basic configuration, the computing device 400 includes at least one processing unit 402 and a system memory 404. According to an aspect, depending on the configuration and type of computing device, the system memory 404 comprises, but is not limited to, volatile storage (e.g., random access memory), non-volatile storage (e.g., read-only memory), flash memory, or any combination of such memories. According to an aspect, the system memory 404 includes an operating system 405 and one or more program modules 406 suitable for running software applications 105, 450. The operating system 110, 405, for example, is suitable for controlling the operation of the computing device 400. Furthermore, aspects are practiced in conjunction with a graphics library, other operating systems, or any other application program, and is not limited to any particular application or system. This basic configuration is illustrated in FIG. 4 by those components within a dashed line 408. According to an aspect, the computing device 400 has additional features or functionality. For example, according to an aspect, the computing device 400 includes additional data storage devices (removable and/or non-removable) such as, for example, magnetic disks, SSDs, HDDs, optical disks, or tape. Such additional storage is illustrated in FIG. 4 by a removable storage device 409 and a non-removable storage device 410.

As stated above, according to an aspect, a number of program modules and data files are stored in the system memory 404. While executing on the processing unit 402, the program modules 406 perform processes including, but not limited to, one or more of the stages of the method 300 illustrated in FIG. 3. According to an aspect, other program modules are used in accordance with examples and include applications such as electronic mail and contacts applications, word processing applications, spreadsheet applications, database applications, slide presentation applications, drawing or computer-aided application programs, etc.

According to an aspect, aspects are practiced in an electrical circuit comprising discrete electronic elements, packaged or integrated electronic chips containing logic gates, a circuit utilizing a microprocessor, or on a single chip containing electronic elements or microprocessors. For example, aspects are practiced via a system-on-a-chip (SOC) where each or many of the components illustrated in FIG. 4 are integrated onto a single integrated circuit. According to an aspect, such an SOC device includes one or more processing units, graphics units, communications units, system virtualization units and various application functionality all of which are integrated (or "burned") onto the chip substrate as a single integrated circuit. When operating via an SOC, the functionality, described herein, is operated via application-specific logic integrated with other components of the computing device 400 on the single integrated circuit (chip). According to an aspect, aspects of the present disclosure are practiced using other technologies capable of performing logical operations such as, for example, AND, OR, and NOT, including but not limited to mechanical, optical, fluidic, and quantum technologies. In addition, aspects are practiced within a general purpose computer or in any other circuits or systems.

According to an aspect, the computing device 400 has one or more input device(s) 412 such as a keyboard, a mouse, a pen, a sound input device, a touch input device, etc. The output device(s) 414 such as a display, speakers, a printer, etc. are also included according to an aspect. The aforementioned devices are examples and others may be used. According to an aspect, the computing device 400 includes one or more communication connections 416 allowing communications with other computing devices 418. Examples of suitable communication connections 416 include, but are not limited to, radio frequency (RF) transmitter, receiver, and/or transceiver circuitry; universal serial bus (USB), parallel, and/or serial ports.

The term computer readable media as used herein include computer storage media. Computer storage media include volatile and nonvolatile, removable and non-removable media implemented in any method or technology for storage of information, such as computer readable instructions, data structures, or program modules. The system memory 404, the removable storage device 409, and the non-removable storage device 410 are all computer storage media examples (i.e., memory storage.) According to an aspect, computer storage media includes RAM, ROM, electrically erasable programmable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 400. According to an aspect, any such computer storage media is part of the computing device 400. Computer storage media does not include a carrier wave or other propagated data signal.

According to an aspect, communication media is embodied by computer readable instructions, data structures, program modules, or other data in a modulated data signal, such as a carrier wave or other transport mechanism, and includes any information delivery media. According to an aspect, the term "modulated data signal" describes a signal that has one or more characteristics set or changed in such a manner as to encode information in the signal. By way of example, and not limitation, communication media includes wired media such as a wired network or direct-wired connection, and wireless media such as acoustic, radio frequency (RF), infrared, and other wireless media.

FIGS. 5A and 5B illustrate a mobile computing device 500, for example, a mobile telephone, a smart phone, a tablet personal computer, a laptop computer, and the like, with which aspects may be practiced. With reference to FIG. 5A, an example of a mobile computing device 500 for implementing the aspects is illustrated. In a basic configuration, the mobile computing device 500 is a handheld computer having both input elements and output elements. The mobile computing device 500 typically includes a display 505 and one or more input buttons 510 that allow the user to enter information into the mobile computing device 500. According to an aspect, the display 505 of the mobile computing device 500 functions as an input device (e.g., a touch screen display). If included, an optional side input element 515 allows further user input. According to an aspect, the side input element 515 is a rotary switch, a button, or any other type of manual input element. In alternative examples, mobile computing device 500 incorporates more or less input elements. For example, the display 505 may not be a touch screen in some examples. In alternative examples, the mobile computing device 500 is a portable phone system, such as a cellular phone. According to an aspect, the mobile computing device 500 includes an optional keypad 535. According to an aspect, the optional keypad 535 is a physical keypad. According to another aspect, the optional keypad 535 is a "soft" keypad generated on the touch screen display. In various aspects, the output elements include the display 505 for showing a graphical user interface (GUI), a visual indicator 520 (e.g., a light emitting diode), and/or an audio transducer 525 (e.g., a speaker). In some examples, the mobile computing device 500 incorporates a vibration transducer for providing the user with tactile feedback. In yet another example, the mobile computing device 500 incorporates input and/or output ports, such as an audio input (e.g., a microphone jack), an audio output (e.g., a headphone jack), and a video output (e.g., a HDMI port) for sending signals to or receiving signals from an external device. In yet another example, the mobile computing device 500 incorporates peripheral device port 540, such as an audio input (e.g., a microphone jack), an audio output (e.g., a headphone jack), and a video output (e.g., a HDMI port) for sending signals to or receiving signals from an external device.

FIG. 5B is a block diagram illustrating the architecture of one example of a mobile computing device. That is, the mobile computing device 500 incorporates a system (i.e., an architecture) 502 to implement some examples. In one example, the system 502 is implemented as a "smart phone" capable of running one or more applications (e.g., browser, e-mail, calendaring, contact managers, messaging clients, games, and media clients/players). In some examples, the system 502 is integrated as a computing device, such as an integrated personal digital assistant (PDA) and wireless phone.

According to an aspect, one or more application programs 550 are loaded into the memory 562 and run on or in association with the operating system 564. Examples of the application programs include phone dialer programs, e-mail programs, personal information management (PIM) programs, word processing programs, spreadsheet programs, Internet browser programs, messaging programs, and so forth. The system 502 also includes a non-volatile storage area 568 (SDDs and/or HDDs) within the memory 562. The non-volatile storage area 568 is used to store persistent information that should not be lost if the system 502 is powered down. The application programs 105, 550 may use and store information in the non-volatile storage area 568, such as e-mail or other messages used by an e-mail application, and the like. A synchronization application (not shown) also resides on the system 502 and is programmed to interact with a corresponding synchronization application resident on a host computer to keep the information stored in the non-volatile storage area 568 synchronized with corresponding information stored at the host computer. As should be appreciated, other applications may be loaded into the memory 562 and run on the mobile computing device 500.

According to an aspect, the system 502 has a power supply 570, which is implemented as one or more batteries. According to an aspect, the power supply 570 further includes an external power source, such as an AC adapter or a powered docking cradle that supplements or recharges the batteries.

According to an aspect, the system 502 includes a radio 572 that performs the function of transmitting and receiving radio frequency communications. The radio 572 facilitates wireless connectivity between the system 502 and the "outside world," via a communications carrier or service provider. Transmissions to and from the radio 572 are conducted under control of the operating system 564. In other words, communications received by the radio 572 may be disseminated to the application programs 550 via the operating system 564, and vice versa.

According to an aspect, the visual indicator 520 is used to provide visual notifications and/or an audio interface 574 is used for producing audible notifications via the audio transducer 525. In the illustrated example, the visual indicator 520 is a light emitting diode (LED) and the audio transducer 525 is a speaker. These devices may be directly coupled to the power supply 570 so that when activated, they remain on for a duration dictated by the notification mechanism even though the processor 560 and other components might shut down for conserving battery power. The LED may be programmed to remain on indefinitely until the user takes action to indicate the powered-on status of the device. The audio interface 574 is used to provide audible signals to and receive audible signals from the user. For example, in addition to being coupled to the audio transducer 525, the audio interface 574 may also be coupled to a microphone to receive audible input, such as to facilitate a telephone conversation. According to an aspect, the system 502 further includes a video interface 576 that enables an operation of an on-board camera 530 to record still images, video stream, and the like.

According to an aspect, a mobile computing device 500 implementing the system 502 has additional features or functionality. For example, the mobile computing device 500 includes additional data storage devices (removable and/or non-removable) such as, magnetic disks, optical disks, or tape. Such additional storage is illustrated in FIG. 5B by the non-volatile storage area 568.

According to an aspect, data/information generated or captured by the mobile computing device 500 and stored via the system 502 is stored locally on the mobile computing device 500, as described above. According to another aspect, the data is stored on any number of storage media that is accessible by the device via the radio 572 or via a wired connection between the mobile computing device 500 and a separate computing device associated with the mobile computing device 500, for example, a server computer in a distributed computing network, such as the Internet. As should be appreciated such data/information is accessible via the mobile computing device 500 via the radio 572 or via a distributed computing network. Similarly, according to an aspect, such data/information is readily transferred between computing devices for storage and use according to well-known data/information transfer and storage means, including electronic mail and collaborative data/information sharing systems.

Implementations, for example, are described above with reference to block diagrams and/or operational illustrations of methods, systems, and computer program products according to aspects. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more examples provided in this application are not intended to limit or restrict the scope as claimed in any way. The aspects, examples, and details provided in this application are considered sufficient to convey possession and enable others to make and use the best mode. Implementations should not be construed as being limited to any aspect, example, or detail provided in this application. Regardless of whether shown and described in combination or separately, the various features (both structural and methodological) are intended to be selectively included or omitted to produce an example with a particular set of features. Having been provided with the description and illustration of the present application, one skilled in the art may envision variations, modifications, and alternate examples falling within the spirit of the broader aspects of the general inventive concept embodied in this application that do not depart from the broader scope.

We claim:

1. A computer-implemented method of improving utilization of data storage media, comprising:
   translating a request to write data to a logical address on a data storage device to a sequentialized address on the data storage device;
   the data storage device having, for the sequentialized address, write areas that includes a write area size, erase areas that includes an erase area size, and a read size,
      the write area size being smaller than the erase area size, the read size being distinct from both the write area size and erase area size,
wherein the data to be written is not an integral multiple of the erase area size;
assigning a first write start address to align with a first erase area;
writing a first portion of the data to the first write start address resulting in the first erase area being partially written; and
marking all sectors of the partially-written first erase area as allocated and associated with the data.

2. The method of claim 1, further comprising, upon receiving a command to delete the data, sending an erase command for an entirety of the erase area.

3. The method of claim 1, further comprising:
if the first portion of the data is written to an end of a file, marking, in a file system metadata, all sectors of the erase area as allocated and associated with the data;
updating a size of the file in the file system metadata to include the first portion of the data;
upon writing a second data, the second data selected from a group consisting of a second portion of the data and second data that is distinct from the data, using the size of the file to determine a next write address within the first erase area for the data;
after writing the first portion of the data, writing the second data to a second address other than the next write address, the next write address selected from the group consisting of a next write address in the first erase area and a next write address in a second erase area outside the first erase area; and
after writing the second data, writing a third portion of the data to append additional data to the next write address associated with the data to be written to the data storage device, the third portion of the data appending data to the end of the file.

4. The method of claim 3, wherein a writing of any portion of the data to any area of the data storage device includes writing the any portion of the data according to a write granularity associated with the data storage device.

5. The method of claim 1, further comprising:
if the first portion of the data is directed to a partially-written erase area, the partially-written erase area including a next writable start address;
allowing a writing of the first portion of the data to a write address other than the next writable start address and other than a written portion of the partially-written erase area;
determining a second erase area, logically contiguous to and following the partially-written erase area, is empty;
allowing a writing of the first portion of the data to the next writable start address of the partially-written erase area;
marking all sectors of the second empty erase area as allocated; and
writing at least a portion of the data of a length extending past an end of the partially-written erase area into the second empty erase area.

6. The method of claim 1, wherein the data storage device is selected from a group comprising: a solid state storage device, a magnetic recording media device, a shingled magnetic recording device, an optical recording devices, and a magnetic tape recording device.

7. The method of claim 6, wherein the write areas and erase areas of the data storage device comprise storage selected from a group consisting of: storage blocks and pages for solid state storage devices, storage sectors and zones for magnetic recording media devices, storage sectors and zones for shingled magnetic recording media devices.

8. The method of claim 3, wherein each portion of the data to be written to the data storage device is written to the data storage device sequentially as individual data portion writes are directed instead of temporarily buffering individual data portion writes, followed by a single write of all buffered data portion writes.

9. The method of claim 1, prior to assigning a first write start address to align with a first erase area, allowing a random reading of any data storage areas of the first erase area.

10. A system for improving utilization of data storage media a data storage system, comprising:
a processor; and
a memory, including instructions, which when executed by the processor are operable to provide:
a file system operative
to control data storage to one or more data storage devices and manage allocation of storage areas on the one or more data storage devices for storage of data;
to receive a request to write data from an application to one of the one or more data storage devices;
to translate a logical address for the data to a sequentialized address in the one data storage device at which the data will be written, wherein the one data storage device has writes areas with a write area size and erase areas with an erase area size;
to assign a first write start address to align with a first erase area, where the data to be written is not an integral multiple of the erase area size if a write area size of the one data storage device is smaller than the erase area size of the one data storage device, and is distinct from a read size of the one data storage device; and
to mark all sectors of the first erase area as allocated and associated with the data; and
a data storage system host layer operative
to translate communications between the file system and the one or more data storage devices; and
to write a first portion of the data to the first write start address on a given one of the one or more data storage devices resulting in the first erase area being partially written.

11. The system of claim 10, wherein the data storage system host layer is further operative, upon receiving a command to delete the data, to send an erase command for an entirety of the erase area.

12. The system of claim 10,
the file system being further operative
to mark, in a file system metadata, all sectors of the first erase area as allocated and associated with the data if the one data storage device allows byte-aligned writes, and the first portion is to an end of a file;
to update a size of the file to include the first portion of the data;
to use the size of the file to determine a next writable address within that same erase area for the data, upon the writing of a second portion of the data;
the data storage system host layer being further operative
to send the second portion of the data to a second address other than the next write address after sending the first portion; and
to send a third portion of the data to append additional data to the next write address associated with the data to be written to the one data storage device after sending the second portion of the data.

13. The system of claim 12,
the file system being further operative
to allow a writing of the first portion to an address other than the partially-written erase area if the first portion is directed to a partially-written erase area, the partially-written erase area including a next writable start address;
to determine a second erase area, logically contiguous to and following the partially-written erase area, is empty;
to allow a writing of the first portion to an address other than the partially-written erase area and the second erase area;
to mark all sectors of the second empty erase area as allocated; and
the data storage system host layer being further operative to write any portion of the data of a length extending past the end of the partially-written erase area into the second erase area.

14. The system of claim 12, further comprising a block allocator interface operative, at the direction of the data storage system host layer,
to direct the writing of any portion of the data, including the first, second and third portions of the data, to the given one of the one or more data storage devices; and
to direct each portion of the data to be written to the data storage device sequentially as individual data portion writes are directed instead of temporarily buffering individual data portion writes, followed by a single write of all buffered data portion writes.

15. The system of claim 14, wherein
the data storage system host layer being further operative to perform one or more data storage management functions that are applicable to a plurality of different data storage devices; and
each of one or more data storage devices onto which data may be written, at the direction of the data storage system host layer, being operative to perform one or more data storage management functions that are applicable to particular data storage devices.

16. The system of claim 15 wherein,
the one or more data storage management functions that are applicable to a plurality of different data storage devices include one or more of sequential data write direction, storage function scheduling, and garbage collection; and
the one or more data storage management functions that are applicable to particular data storage devices include one or more of powered-on data retention, logical to physical storage device mapping, data encryption, error-correcting code operations, bad block mapping, and wear-leveling.

17. A computer readable storage device, comprising computer storage media, including instructions, which when executed by a processor are operable to perform a method of improving utilization of data storage media, comprising:
receiving a request to write data from an application to a data storage device;
translating, via a file system, a logical address for the data to a sequentialized address in the data storage device at which the data will be written, wherein the data storage device includes write areas having a write area size, erase areas having an erase area size, and a read size;
if the write area sixe of the data storage device is smaller than the erase area size of the data storage device, and distinct from the read size of the data storage device, assigning a first write start address to align with a first erase area;
writing a first portion of the data to the first write start address;
marking all sectors of the first erase area as allocated and associated with the data;
upon receiving a command to delete the data, sending an erase command for an entirety of the erase area;
if the data storage device allows byte-aligned writes, and the first portion is to an end of a file, marking, in a file system metadata, all sectors of the first erase area as allocated and associated with the data;
updating a size of the data to include the first portion of the data;
upon writing a second portion of the data, using the size of the data to determine a next writable address within the same erase area for the data;
after sending the first portion, sending the second portion of the data to a second address other than the next write address;
after sending the second portion of the data, sending a third portion of the data to append additional data to the next write address associated with the data to be written to the data storage device;
if the first portion is directed to a partially-written erase area, the partially-written erase area including a next writable start address, allowing a writing of the first portion to an address other than the partially-written erase area;
determining a second erase area, logically contiguous to and following the partially-written erase area, is empty;
allowing a writing of the first portion to an address other than the partially-written erase area and the second erase area;
marking all sectors of the second empty erase area as allocated; and
writing any portion of the data of a length extending past the end of the partially-written erase area into the second erase area.

18. A computer-implemented method of improving utilization of data storage media, comprising:
receiving a request to write data from an application to a sequentialized address on a data storage device;
the data storage device having, for the sequentialized address, writes areas that includes a write area size, erase areas that includes an erase area size, and a read size,
the write area size being smaller than the erase area size,
the read size being distinct from both the write area size and erase area size,
wherein the data to be written is not an integral multiple of the erase area size;
assigning a first write start address to align with a first erase area;
writing a first portion of the data to the first write start address resulting in the first erase area being partially written, wherein the first write start address is at a logical address that is not aligned with any erase area of the data storage device; and
marking all sectors of the partially-written first erase area as allocated and associated with the data.

* * * * *